(12) United States Patent
Maeda

(10) Patent No.: US 6,335,649 B1
(45) Date of Patent: Jan. 1, 2002

(54) SCHMITT TRIGGER CIRCUIT

(75) Inventor: Koji Maeda, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/336,997

(22) Filed: Jun. 21, 1999

(30) Foreign Application Priority Data

Jun. 22, 1998 (JP) .......................................... 10-174869

(51) Int. Cl.[7] .............................................. H03K 3/037
(52) U.S. Cl. ........................ 327/206; 327/215; 327/225
(58) Field of Search ................................. 327/199, 205, 327/206, 207, 208, 215, 217, 73, 225, 223, 214, 216, 218, 219

(56) References Cited

U.S. PATENT DOCUMENTS

| 4,563,594 A | * | 1/1986 | Koyama ..................... 327/206 |
| 4,603,264 A | * | 7/1986 | Nakano ...................... 327/206 |
| 4,719,367 A | * | 1/1988 | Denda ........................ 327/206 |
| 4,859,873 A | * | 8/1989 | O'Shaughnessy et al. .... 327/74 |
| 5,036,226 A | * | 7/1991 | Tonnu et al. ................. 326/71 |
| 5,327,020 A | * | 7/1994 | Ikeda ......................... 327/206 |

FOREIGN PATENT DOCUMENTS

JP          401073912 A  *  9/1987

* cited by examiner

Primary Examiner—Timothy P. Callahan
Assistant Examiner—Hai L. Nguyen
(74) Attorney, Agent, or Firm—McGuireWoods LLP

(57) ABSTRACT

A Schmitt trigger circuit of the present invention comprises a first inverter for setting a positive trigger voltage corresponding to a threshold level when an input signal is changed in a direction from a low voltage level to a high voltage level, a second inverter for setting a negative trigger voltage corresponding to a threshold level when an input signal is changed in a direction from a high voltage level to a low voltage level. The Schmitt trigger circuit of the present invention further comprises a level shift circuit for shifting the input signal voltage level down by a constant voltage and supplying the voltage shifted input signal to the first inverter.

20 Claims, 4 Drawing Sheets

SCHMITT TRIGGER CIRCUIT

BACKGROUND OF THE INVENTION

1. Field of the Invention

The present invention relates to a semiconductor circuit, in particular to a Schmitt trigger circuit having hysterisis characteristics in threshold level.

2. Description of Related Art

A signal transmitted long distance by such as bus line may contain substantial noise. In order to prevent an erroneous operation of a signal processing device due to such noise mixed in the signal, a Schmitt trigger circuit is frequently used.

The Schmitt trigger circuit has hysterisis characteristics in its threshold level. FIG. 2 is a block circuit diagram showing an example of construction of a conventional Schmitt trigger circuit and FIG. 3 is a circuit diagram showing an example of construction of an inverter used in the Schmitt trigger circuit shown in FIG. 2.

In FIG. 2, the conventional Schmitt trigger circuit is constructed with a first and second inverters INV1 and INV2 each of which inverts an input signal Vin input to an input terminal 6 of the Schmitt trigger circuit at a predetermined threshold level as a boundary, a third inverter INV3 which inverts an output signal of the second inverter INV2, an RS flip-flop 7 composed of two NAND gates NAND1 and NAND2 and a fourth inverter INV4 which inverts an output signal of the RS flip-flop 7 and outputs the inverted signal as an output signal Vo through an output terminal 8 of the Schmitt trigger circuit.

Incidentally, a voltage (threshold voltage level) of the input signal Vin at which the output signal Vo is switched from an L (low) voltage level to a H (high) voltage level when the input signal Vin is changed in a direction from an L voltage level to a H voltage level is referred to as "positive trigger voltage". A voltage (threshold voltage level) of the input signal Vin at which the output signal Vo is switched from the H voltage level to the L voltage level when the input signal Vin is changed in a direction from the H voltage level to the L voltage level is referred to as "negative trigger voltage".

A threshold voltage level of the first inverter INV1 is equal to the positive trigger voltage of the Schmitt trigger circuit, which is high compared with a threshold voltage level of the third inverter INV3 or the fourth inverter INV4. A threshold voltage level of the second inverter INV2 is equal to a negative trigger voltage of the Schmitt trigger circuit, which is low compared with the threshold level of the third inverter INV3 or the fourth inverter INV4.

In FIG. 3, each of the first to fourth inverters INV1 to INV4 is composed of a P channel MOSFET 91 and an N channel MOSFET 92 which have drains D connected commonly and gates G connected commonly too. A source S of the P channel MOSFET 91 is connected to a power source $V_{DD}$ and a source S of the N channel MOSFET 92 is grounded. A signal is input to the gates G of the P channel MOSFET 91 and the N channel MOSFET 92 and an output signal obtained by inverting the input signal is output from the drains D thereof.

Incidentally, the threshold voltage levels of the first to fourth inverters INV1 to INV4 are determined by ratios of resistances of the P channel MOSFET's 91 and 92 thereof, respectively.

An operation of the Schmitt trigger circuit shown in FIG. 2 will be described with reference to FIG. 4 which shows a timing chart of the operation of the Schmitt trigger circuit.

In FIG. 4, when an input signal Vin having a waveform such as shown in FIG. 4(a) is inputted to the input terminal 6, the first inverter INV1 outputs an inverted signal with a timing shown in FIG. 4(b), since the threshold level of the first inverter INV1 is set to the high level compared with the threshold level of the third inverter INV3 or the fourth inverter INV4.

On the other hand, the second inverter INV2 outputs the inverted signal with a timing shown in FIG. 4(c), since the threshold level of the second inverter INV2 is set to the low value.

An output of the RS flip-flop 7 is set to a L level when the input from the first inverter INV1 is the L level and reset to a H level when the input from the third inverter INV3 is in the L level. That is, as shown in FIG. 4(d), the output of the RS flip-flop 7 is switched from the H level to the L level with the timing of the threshold level of the first inverter INV1 when the input signal Vin is changed in a direction from the L level to the H level and switched from the L level to the H level with the timing of the threshold level of the second inverter INV2 when the input signal Vin is changed in a direction from the H level to the L level. In this manner, the Schmitt trigger circuit can have the hysterisis characteristics.

Although the RS flip-flop 7 is constructed with the two NAND gates in FIG. 2, the RS flip-flop may be constructed with two NOR gates.

As mentioned above, since the threshold level of the inverter is determined by the ratio of resistances of the P channel MOSFET and the N channel MOSFET constituting the inverter, it is necessary to set a value of resistance of the N channel MOSFET large compared with that of the P channel MOSFET when the threshold level of the first inverter is set.

Therefore, when the threshold level of the first inverter is made high in the conventional Schmitt trigger circuit shown in FIG. 2, a drive performance of the N channel MOSFET of the inverter is lowered, so that a delay time of the Schmitt trigger circuit is increased.

SUMMARY OF THE INVENTION

An object of the present invention is to provide a Schmitt trigger circuit capable of preventing a delay time from being increased.

In order to achieve the above object, the Schmitt trigger circuit having hysterisis characteristics in threshold level, according to the present invention, comprises a first inverter for setting a positive trigger voltage which is a threshold voltage level when an input signal is changed in a direction from a low voltage level to a high voltage level, a second inverter for setting a negative trigger voltage which is a threshold level when an input signal is changed in a direction from a high voltage level to a low voltage level, and a level shift circuit for shifting the input signal voltage level down by a constant voltage and supplying the voltage shifted input signal to the first inverter.

In the present Schmitt trigger circuit having the level shift circuit for lowering the input voltage by a predetermined constant voltage and supplying it to the first inverter, it is possible to set the positive trigger voltage to a similar value to that in the conventional Schmitt trigger circuit even when the threshold level of the first inverter is set to a value lower than the conventional value by the predetermined constant voltage.

BRIEF DESCRIPTION OF THE DRAWINGS

The above mentioned and other objects, features and advantages of the present invention will become more apparent by reference to the following detailed description of the invention taken in conjunction with the accompanying drawings, in which.

DETAILED DESCRIPTION OF THE PREFERRED EMBODIMENTS

An embodiment of the present invention will be described with reference to the accompanying drawings.

Figure 1:
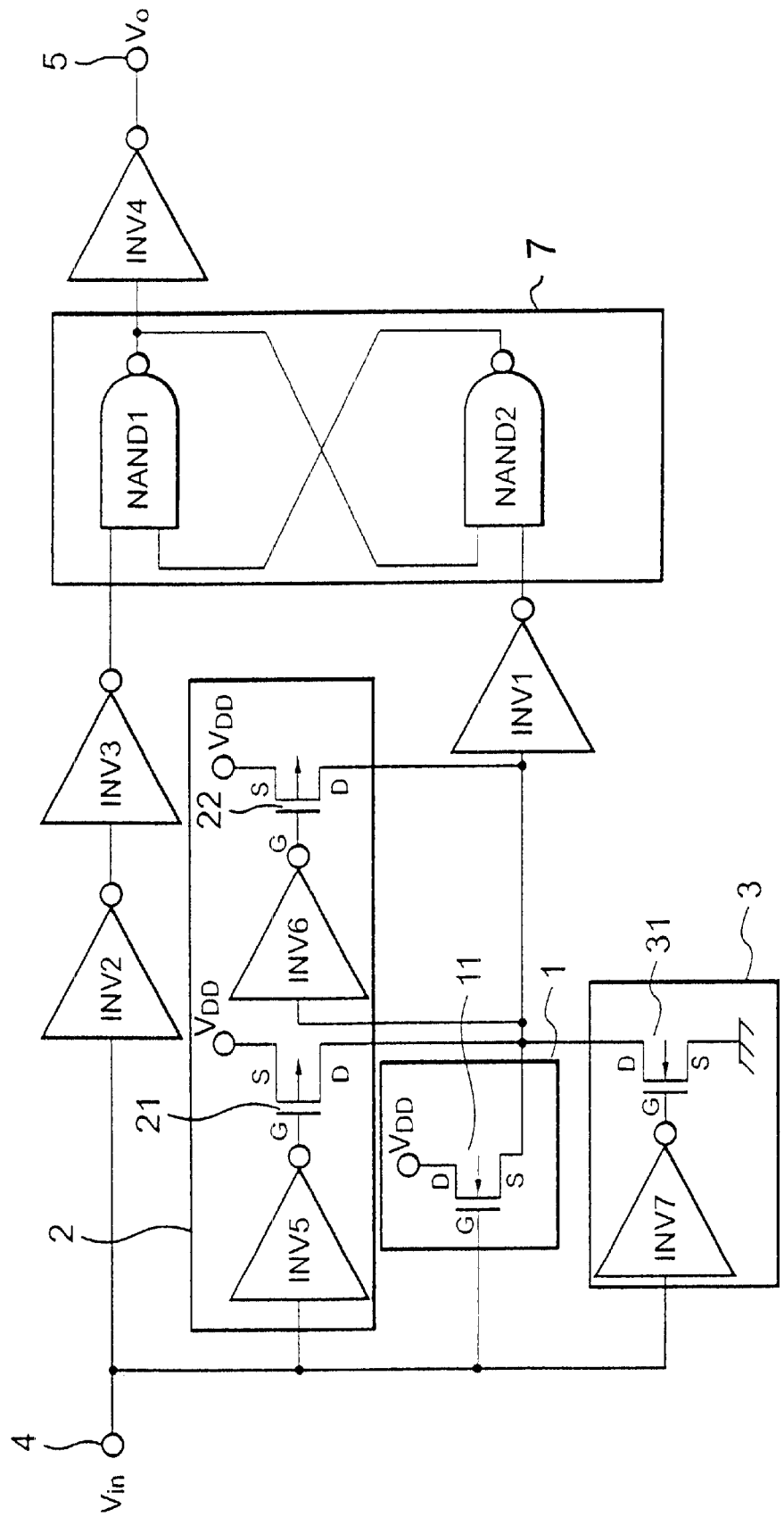
FIG. 1 is a circuit diagram showing an example of construction of a Schmitt trigger circuit according to the present invention.
Figure 2:
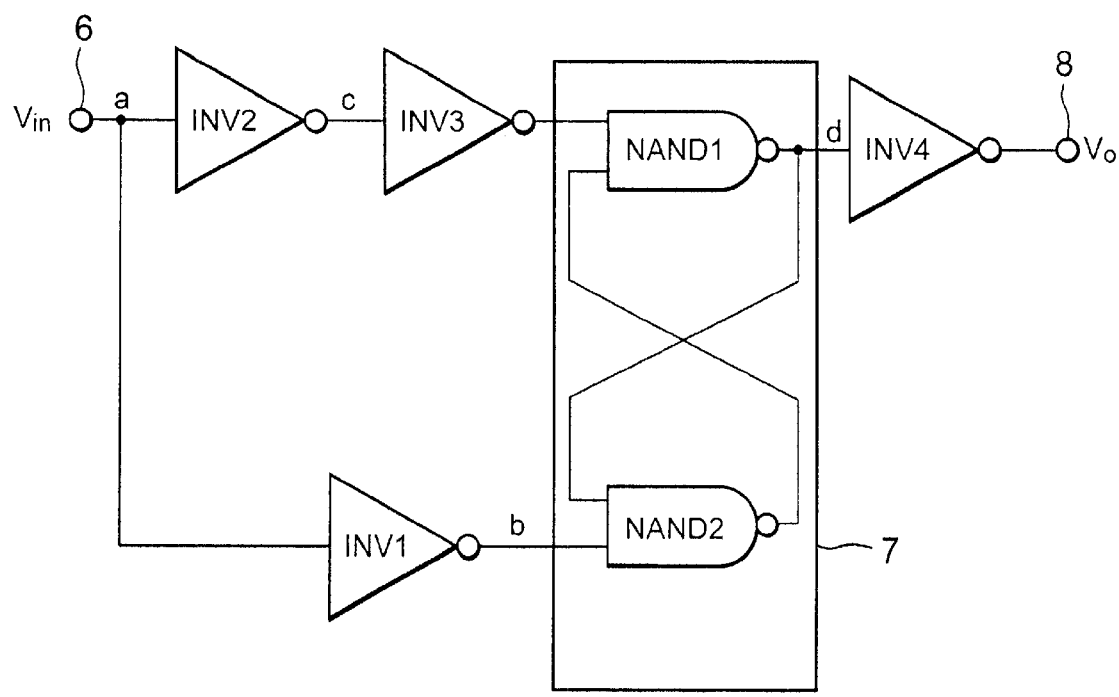
FIG. 2 is a circuit diagram showing a construction of a conventional Schmitt trigger circuit.
Figure 3:
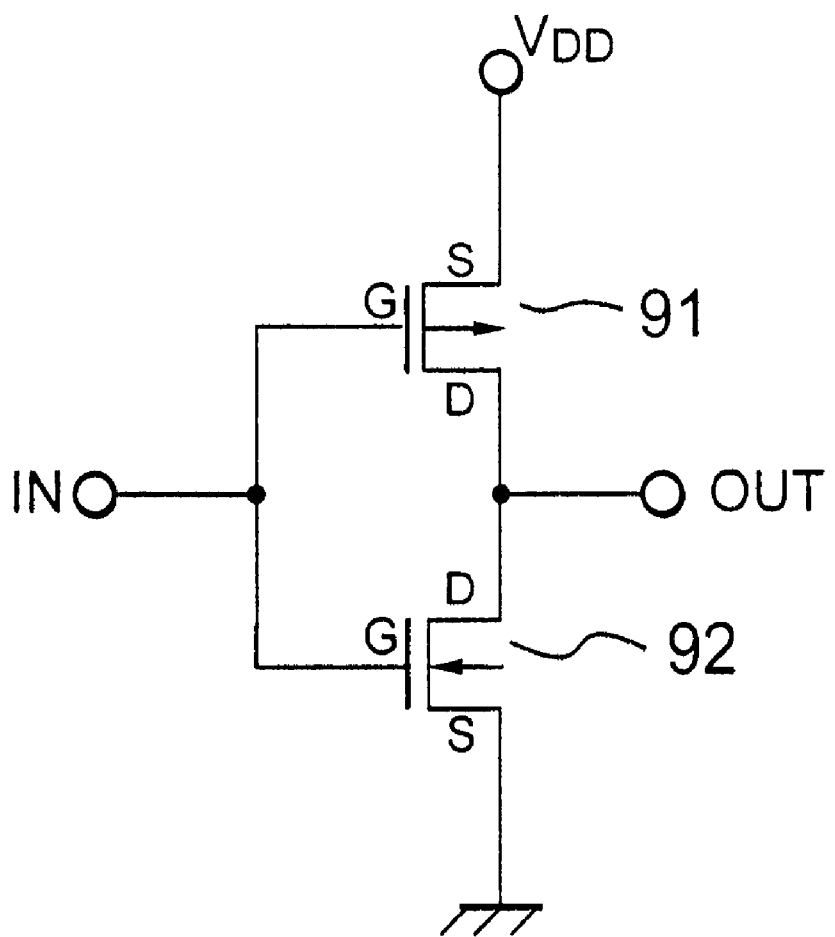
FIG. 3 is a circuit diagram of an example of a construction of a conventional inverter shown in FIG. 2.
Figure 4:
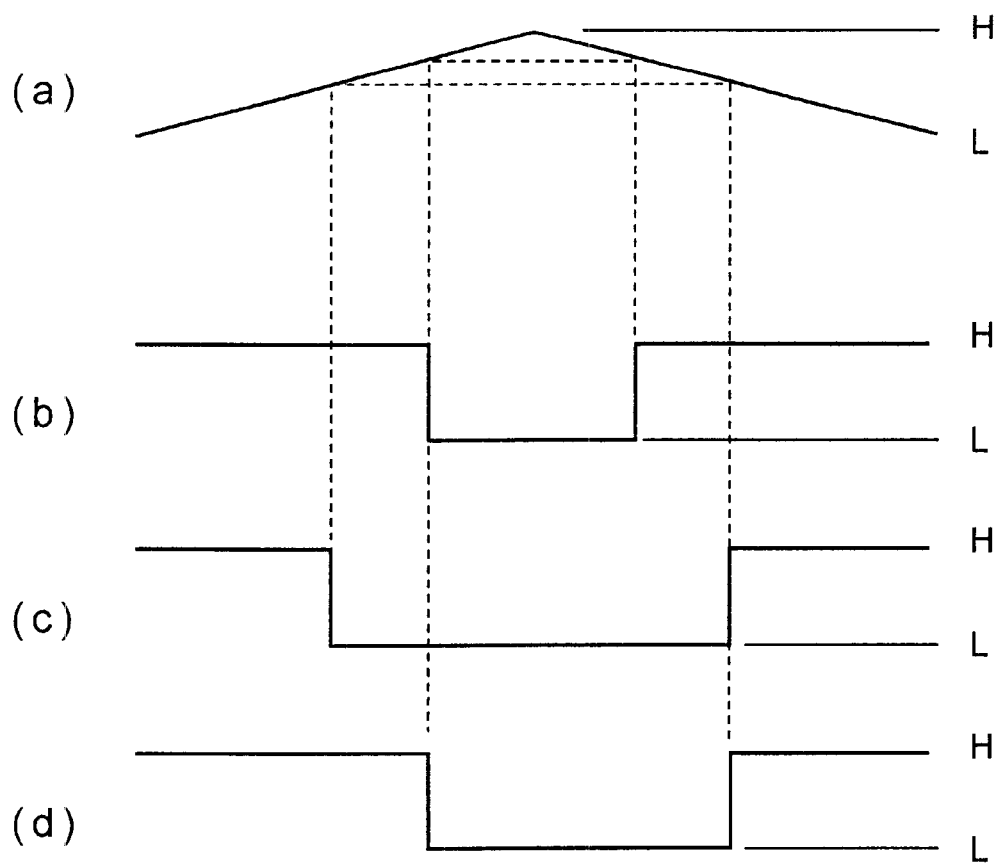
FIG. 4 is a timing chart showing an operation of the Schmitt trigger circuit shown in FIG. 2.

In FIG. 1 which shows an example of construction of a Schmitt trigger circuit according to the present invention, the Schmitt trigger circuit comprises a first to third inverters INV1 to INV3, an RS flip-flop 7 and a fourth inverter INV4 as in the case of the conventional Schmitt trigger circuit shown in FIG. 2. The present Schmitt trigger circuit further comprises a level shift circuit 1 provided on an input of the first inverter INV1, which lowers an input signal Vin by a predetermined constant voltage, a first compensation circuit 2 for pulling the input voltage of the first inverter INV1 up to a power source voltage and a second compensation circuit 3 for pulling the input voltage of the first inverter INV1 down to a ground potential. Since other portion of the present construction than that mentioned above is similar to that of the conventional Schmitt trigger circuit, detailed description thereof is omitted. For example, a threshold voltage level of the first inverter INV1 is equal to the positive trigger voltage of the Schmitt trigger circuit, which is high compared with a threshold voltage level of the third inverter INV3 or the fourth inverter INV4. A threshold voltage level of the second inverter INV2 is equal to a negative trigger voltage of the Schmitt trigger circuit, which is low compared with the threshold level of the third inverter INV3 or the fourth inverter INV4.

The level shift circuit 1 is constructed with a first N channel MOSFET 11 having a gate G connected to an input terminal 4, a drain D connected to a power source $V_{DD}$ and a source S connected to an input of the first inverter INV1.

The first compensation circuit 2 is constructed with a fifth inverter INV5 for inverting the input signal Vin which is input to the input terminal 4 with a predetermined threshold level as a boundary, a first P channel MOSFET 21 having a gate G connected to an output of the fifth inverter INV5, a source S connected to the power source $V_{DD}$ and a drain D connected to the input terminal of the first inverter INV1, a sixth inverter INV6 to which an output signal of the level shift circuit 1 and a second P channel MOSFET 22 having a source S connected to the power source $V_{DD}$, a gate G connected to an output of the sixth inverter INV6 and a drain D connected to the input terminal of the first inverter INV1.

The second compensation circuit 3 comprises a seventh inverter INV7 for inverting the input signal Vin input to the input terminal 4 with a predetermined threshold level as a boundary and a second N channel MOSFET 31 having a gate G connected to an output of the seventh inverter INV7, a source S grounded and a drain D connected to the input terminal of the first inverter INV1.

Threshold levels of the fifth inverter INV5, the sixth inverter INV6 and the seventh inverter INV7 are set to a value equal to a positive trigger voltage of the Schmitt trigger circuit shown in FIG. 1.

Now, an operation of the Schmitt trigger circuit of the present invention will be described.

Since, as shown in FIG. 1, the input signal Vin is inputted to the first inverter INV1 through the first N channel MOSFET 11, a voltage which is lower than the voltage of the input signal Vin by a threshold voltage Vth of the first N channel MOSFET 11 is supplied to the first inverter INV1. That is, the positive trigger voltage can be set to a value similar to the conventional positive trigger voltage even when the threshold level of the first inverter INV1 is set to the voltage which is lower than the input signal voltage by the threshold voltage Vth of the first N channel MOSFET 11.

Since, therefore, it is possible to lower the threshold level of the first inverter INV1 compared with that in the conventional Schmitt trigger circuit, it becomes possible to make the resistance value of the N channel MOSFET of the first inverter INV1 smaller compared with the conventional circuit to thereby prevent the degradation of drive performance of the first inverter INV1 from occurring, resulting in the Schmitt trigger circuit having a large hysterisis characteristics and a short delay time.

When, for example, an input signal Vin whose H level is as low as the threshold level is inputted to the Schmitt trigger circuit shown in FIG. 1 having the level shift circuit 1, a leak current of the first inverter INV1 itself may be increased.

The first compensation circuit 2 and the second compensation circuit 3 are provided in order to solve the above mentioned possible problem of the increase of leak current. The first compensation circuit 1 pulls the input voltage of the first inverter INV1 up to the power source voltage $V_{DD}$ when the input signal Vin is in the H level (at a time the input signal Vin exceeds the positive trigger voltage). On the other hand, the second compensation circuit 3 pulls the input voltage of the first inverter INV1 down to the ground potential when the input signal Vin is in the L level (at a time the input signal Vin is lowered from the positive trigger voltage).

As mentioned above, when the input signal Vin exceeds the positive trigger voltage, the fifth inverter INV5, the sixth inverter INV6 and the seventh inverter INV7 output L level signals, so that the first P channel MOSFET 21 and the second P channel MOSFET 22 are turned on and the second N channel MOSFET 31 is turned off. Therefore, the power source voltage $V_{DD}$ is inputted to the first inverter INV1.

On the other hand, when the input signal voltage Vin becomes lower than the positive trigger voltage, the fifth inverter INV5, the sixth inverter INV6 and the seventh inverter INV7 output H level signals, so that the first P channel MOSFET 21 and the second P channel MOSFET 22 are turned off and the second N channel MOSFET 31 is turned on. Therefore, the ground potential is inputted to the first inverter INV1.

As a result, the increase of the leak current of the first inverter INV1 is prevented and the circuit operation is stabilized, by the provision of the first and second compensation circuits 2 and 3.

Although the level shift circuit 1 is composed of the single stage of N channel MOSFET in the described embodiment, it may be constructed with a plurality of N channel MOSFET stages. Alternatively, other construction of the level shift circuit may be used so long as it can shift the input voltage level of the first inverter INV1.

With the provision of the level shift circuit which functions to lower the input voltage by a predetermined constant voltage and input the lowered voltage to the first inverter, it is possible to set the positive trigger voltage to a similar value to that of the conventional voltage even when the threshold level of the first inverter is set to a voltage value which is lower than the conventional value by a predetermined constant voltage.

Since, therefore, it is possible to lower the threshold level of the first inverter compared with the conventional threshold level, it becomes possible to make the resistance value of the N channel MOSFET of the first inverter small compared with the conventional resistance value and prevent the drive performance of the first inverter, resulting in the Schmitt trigger circuit having large hysterisis characteristics and short delay time.

Further, with the provision of the first compensation circuit and the second compensation circuit, the increase of leak current of the first inverter is prevented and the circuit operation is stabilized.

Although the present invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A Schmitt trigger circuit having a hysterisis characteristics in its threshold level, comprising:
    a first inverter having a first trigger voltage corresponding to a threshold level when an input signal is changed in a direction from a first voltage level to a second voltage level;
    a second inverter having a second trigger voltage corresponding to a threshold level when said input signal is changed in a direction from said second voltage level to said first voltage level; and
    a level shift circuit for shifting a voltage level of said input signal and supplying the voltage shifted input signal to said first inverter,
    wherein said level shift circuit is operable to shift said voltage level of said input signal by a constant voltage.

2. The Schmitt trigger circuit as claimed in claim 1, wherein said level shift circuit includes an N channel MOSFET.

3. A Schmitt trigger circuit, comprising:
    a flip-flop circuit having first and second input nodes and an output node;
    an input terminal supplied with an input voltage;
    first and second inverters coupled in series between said input terminal and said first node of said flip-flop circuit;
    a level shift circuit having an input coupled to said input terminal; and
    a third inverter coupled between an output of said level shift circuit and the second input node of said flip-flop circuit.

4. A Schmitt trigger circuit having a hysterisis characteristics in its threshold level comprising:
    a first inverter having a first trigger voltage corresponding to a threshold level when an input signal is changed in a direction from a first voltage level to a second voltage level;
    a second inverter having a second trigger voltage corresponding to a threshold level when said input signal is changed in a direction from said second voltage level to said first voltage level;
    a level shift circuit for shifting a voltage level of said input signal and supplying the voltage shifted input signal to said first inverter; and
    a first compensation circuit which pulls the input voltage of said first inverter up to a first power source voltage when a voltage level of the input signal exceeds a positive trigger voltage.

5. The Schmitt trigger circuit as claimed in claim 4, wherein said first compensation circuit comprises:
    a third inverter which switches a level of its output voltage when said input signal reaches the positive trigger voltage; and
    a first transistor which supplies said first power source voltage to the input of said first inverter when the output voltage of said third inverter is in said second voltage level and does not supply said first power source voltage to said input of said first inverter when the output voltage of said third inverter is in said first voltage level.

6. The Schmitt trigger circuit as claimed in claim 4, further comprising a second compensation circuit which pulls the input of said first inverter down to a second power source voltage when a voltage level of the input signal is lowered below the positive trigger voltage.

7. The Schmitt trigger circuit as claimed in claim 6, wherein said second compensation circuit comprises:
    a fourth inverter which switches a level of its output voltage when said input signal reaches the positive trigger voltage; and
    a second transistor which supplies said second power source voltage to the input of said first inverter when an output voltage of said fourth inverter is in said first voltage level and does not supply said second power source voltage to the input of said first inverter when the output voltage of said fourth inverter is in said second voltage level.

8. A Schmitt trigger circuit comprising:
    a first inverter having a first threshold voltage and receiving an input signal;
    a second inverter receiving a first output signal from said first inverter;
    a level shift circuit receiving said input signal;
    a third inverter receiving said a second output signal from said level shift circuit; and
    a logic circuit responding to third and fourth output signals from said second and third inverters to produce a fifth output signal.

9. The Schmitt trigger circuit as claimed in claim 8, wherein said level shift circuit includes a N channel MOSFET having a gate receiving said input signal, a drain coupled to a first power source line, and a source coupled to an input of said third inverter.

10. The Schmitt trigger circuit as claimed in claim 9, wherein said logic circuit is RS flip-flop.

11. The Schmitt trigger circuit as claimed in claim 8, said Schmitt trigger circuit further comprising:
    a first compensation circuit which pulls the input voltage of said third inverter up to a first power source voltage when a voltage level of the input signal exceeds said first threshold voltage.

12. The Schmitt trigger circuit as claimed in claim 10, wherein said first compensation circuit comprises a fourth inverter receiving said input signal and having said first threshold voltage, and a first transistor responding an output of said fourth inverter to supply a power source voltage to an input of said third inverter.

13. The Schmitt trigger circuit as claimed in claim 11, said Schmitt trigger circuit further comprising: a second compensation circuit which pulls the input voltage of said first inverter down to a second power source voltage when a voltage level of the input signal is lowered below said first threshold voltage.

14. The Schmitt trigger circuit as claimed in claim 13, wherein said second compensation circuit comprises a fifth inverter receiving said input signal and having said first threshold voltage, and a second transistor responding an output of said fifth inverter to lower a voltage level of an input of said third inverter to a second power source voltage.

15. A Schmitt trigger circuit having improved driver performance comprising:

a first inverter connected to a first input of a flip-flop;

a second inverter and a third inverter connected in series connected to a second input of the flip-flop, said first, second and third inverters each comprising a PMOS transistor and an NMOS transistor connected in series, a threshold voltage of said inverters being determined by a ratios of resistances between said PMOS transistor and said NMOS transistor;

an input port for supplying an input signal to said second inverter; and a level shift circuit connected between said input port and said first inverter for reducing the level of the input signal to said first inverter such that a resistance value of the NMOS transistor in said first inverter can be reduced to prevent degradation of drive performance.

16. A Schmitt trigger circuit as recited in claim 15, further comprising:

a first compensation circuit connected between said input port and said first inverter for pulling said input signal up to a power supply voltage if said input signal is a high signal; and a second compensation circuit connected between said input port and said first inverter for pulling said input signal down to ground potential if said input signal is a low signal.

17. A Schmitt trigger circuit as recited in claim 15 wherein said level shift circuit comprises a single transistor for reducing the level of the input signal to said first inverter by a threshold voltage of said single transistor.

18. A Schmitt trigger circuit comprising:

a flip-flop circuit having first and second input nodes and an output node;

an input terminal supplied with an input voltage;

first and second inverters coupled in series between said input terminal and said first node of said flip-flop circuit;

a level shift circuit having an input coupled to said input terminal; and a third inverter coupled between an output of said level shift circuit and the second input node of said flip-flop circuit, wherein said level shift circuit includes a transistor of a source-follower type.

19. The Schmitt trigger circuit as claimed in claim 18, said Schmitt trigger circuit further comprising:

a first transistor having a current path coupled between said output of said level shift circuit and a first power source line; and a fourth inverter coupled between said input terminal and a control terminal of said first transistor.

20. The Schmitt trigger circuit as claimed in claim 19, said Schmitt trigger circuit further comprising:

a second transistor having a current path coupled between said output of said level shift circuit and a second power source line; and a fifth inverter coupled between said input terminal and a control terminal of said second transistor.

* * * * *